(12) United States Patent  
Margalit et al.

(10) Patent No.: US 8,948,227 B2  
(45) Date of Patent: Feb. 3, 2015

(54) ISOLATED MODULATOR ELECTRODES FOR LOW POWER CONSUMPTION

(71) Applicants: Near Margalit, Westlake Village, CA (US); Mark Heimbuch, Chatsworth, CA (US); Xingang Zhang, Chatsworth, CA (US)

(72) Inventors: Near Margalit, Westlake Village, CA (US); Mark Heimbuch, Chatsworth, CA (US); Xingang Zhang, Chatsworth, CA (US)

(73) Assignee: Source Photonics, Inc., Chatsworth, CA (US)

( * ) Notice: Subject to any disclaimer, the term of this patent is extended or adjusted under 35 U.S.C. 154(b) by 8 days.

(21) Appl. No.: 13/740,140

(22) Filed: Jan. 11, 2013

(65) Prior Publication Data

US 2014/0198816 A1 Jul. 17, 2014

(51) Int. Cl.
*H01S 5/00* (2006.01)
*H01S 5/042* (2006.01)

(52) U.S. Cl.
CPC ..................... *H01S 5/0425* (2013.01)
USPC ........................................ 372/50.12

(58) Field of Classification Search
CPC ............................. H01S 5/0425; H01S 5/042
USPC ............................. 372/45.01; 385/14; 438/31
See application file for complete search history.

(56) References Cited

U.S. PATENT DOCUMENTS

| | | | |
|---|---|---|---|
| 6,452,220 B1 | 9/2002 | Morse et al. | |
| 6,707,589 B2 | 3/2004 | Bostak et al. | |
| 6,825,964 B2 | 11/2004 | Singh et al. | |
| 6,999,489 B2 | 2/2006 | Peters | |
| 7,010,179 B2 | 3/2006 | Hatta et al. | |
| 7,199,441 B2 * | 4/2007 | Shimizu et al. | 257/446 |
| 7,751,658 B2 * | 7/2010 | Welch et al. | 385/14 |
| 2012/0183306 A1 | 7/2012 | Inoue | |

* cited by examiner

*Primary Examiner* — Tuan Nguyen
(74) *Attorney, Agent, or Firm* — Andrew D. Fortney; Central California IP Group, P.C.

(57) ABSTRACT

A light-emitting device, multi-channel light-emitting device, and method(s) of making the same are disclosed. The light-emitting device can include a substrate; a lower contact layer on or over the substrate comprising a first lower contact in a first region and a plurality of second lower contacts in a second region; a plurality of light-emitting thin film devices on or over the first lower contact in the first region; a plurality of light-modulating thin film devices on or over the plurality of second lower contacts in the second region; a plurality of first upper contacts on or over the plurality of light-emitting thin film devices; a plurality of second upper contacts on or over the plurality of light-modulating thin film devices; and an isolation region between the first and second regions, electrically separating the plurality of first upper contacts and the plurality of second upper contacts.

27 Claims, 11 Drawing Sheets

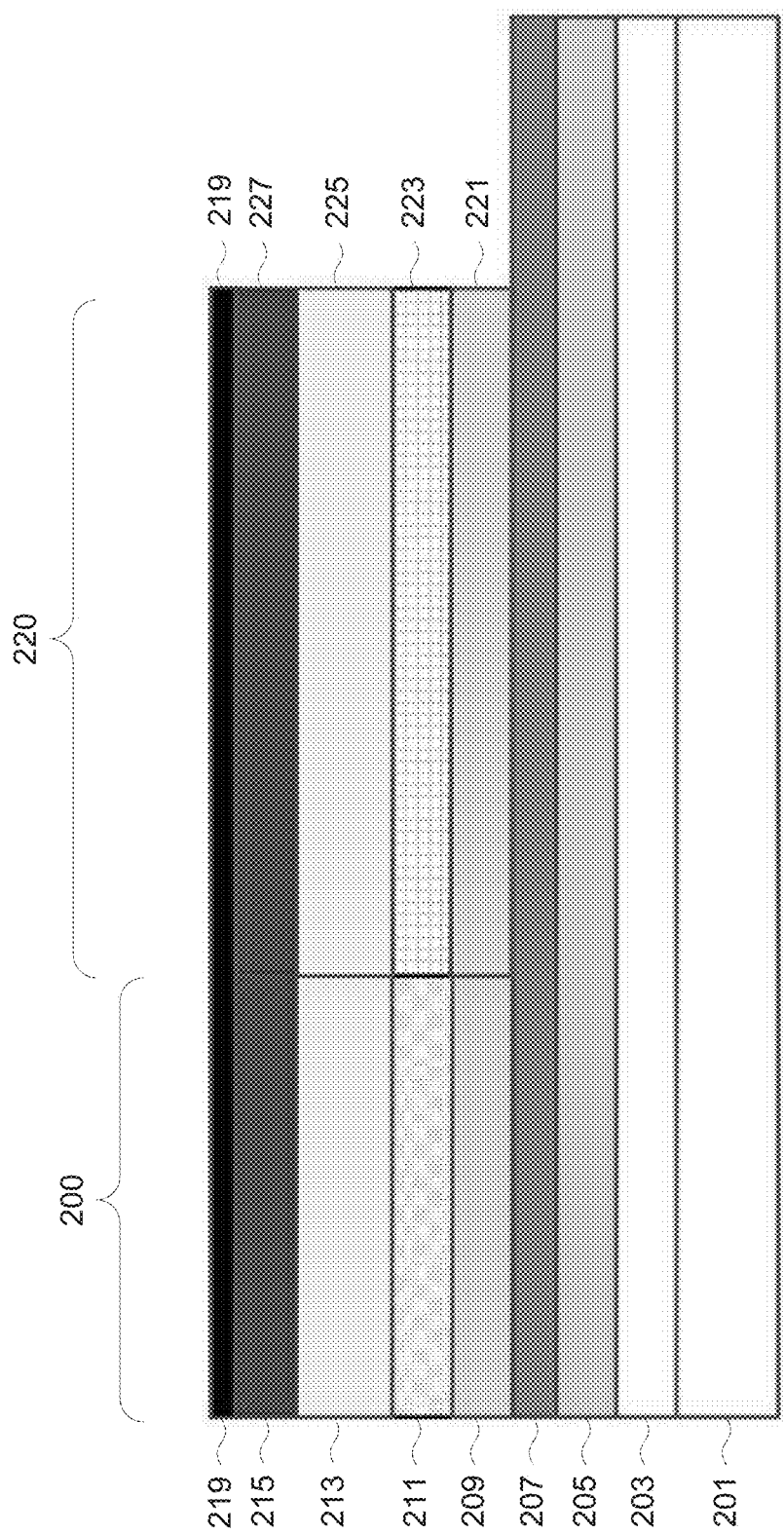

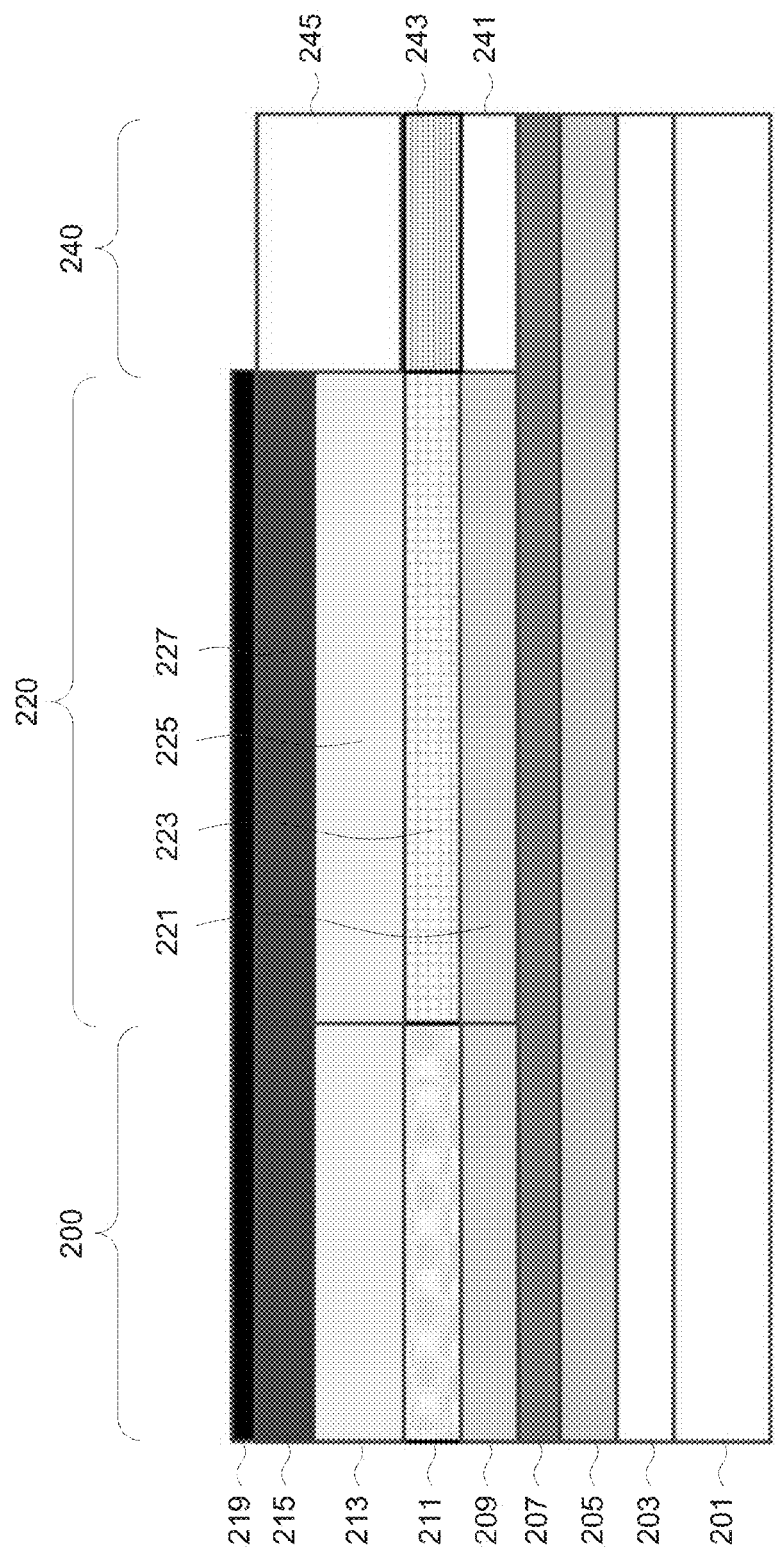

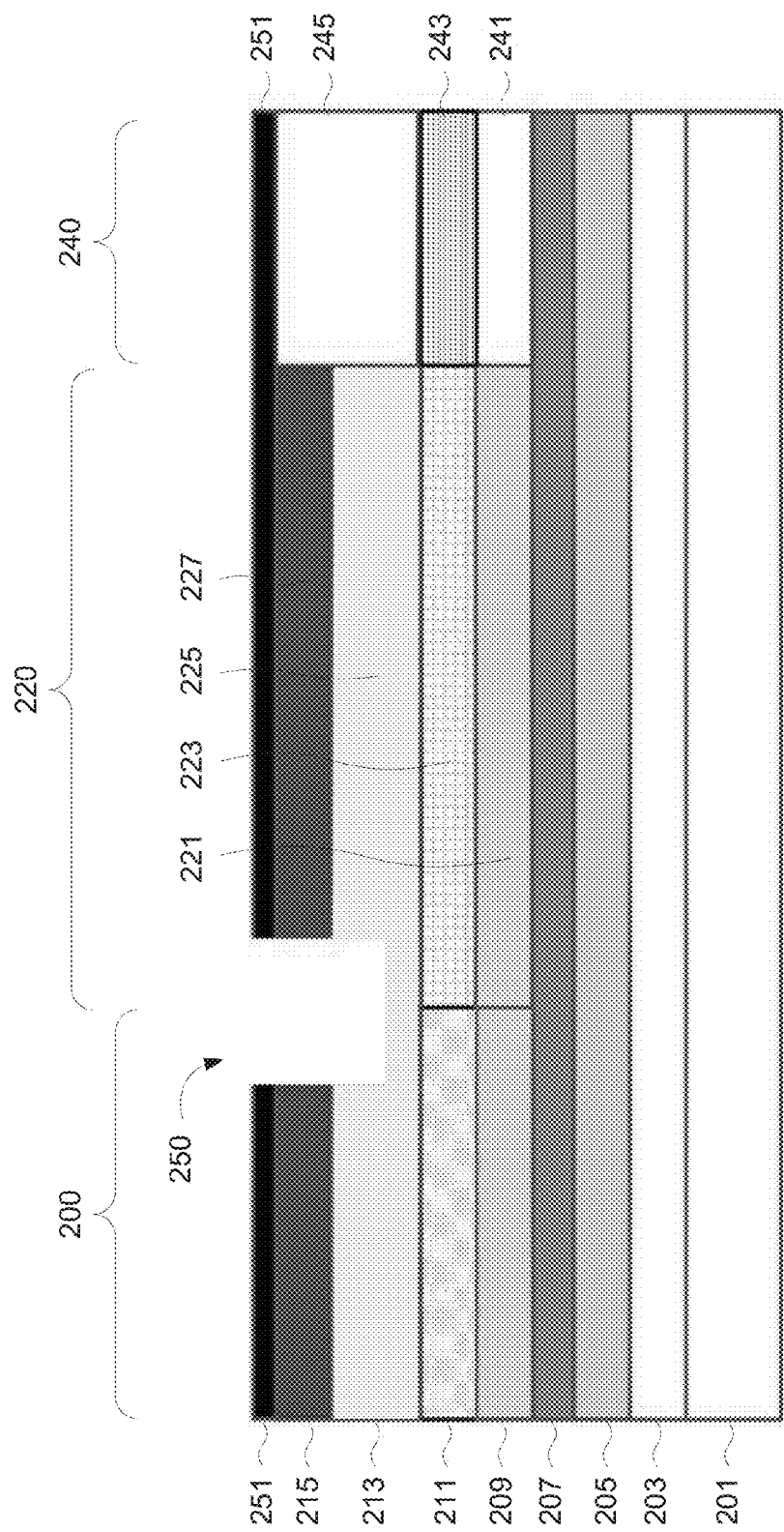

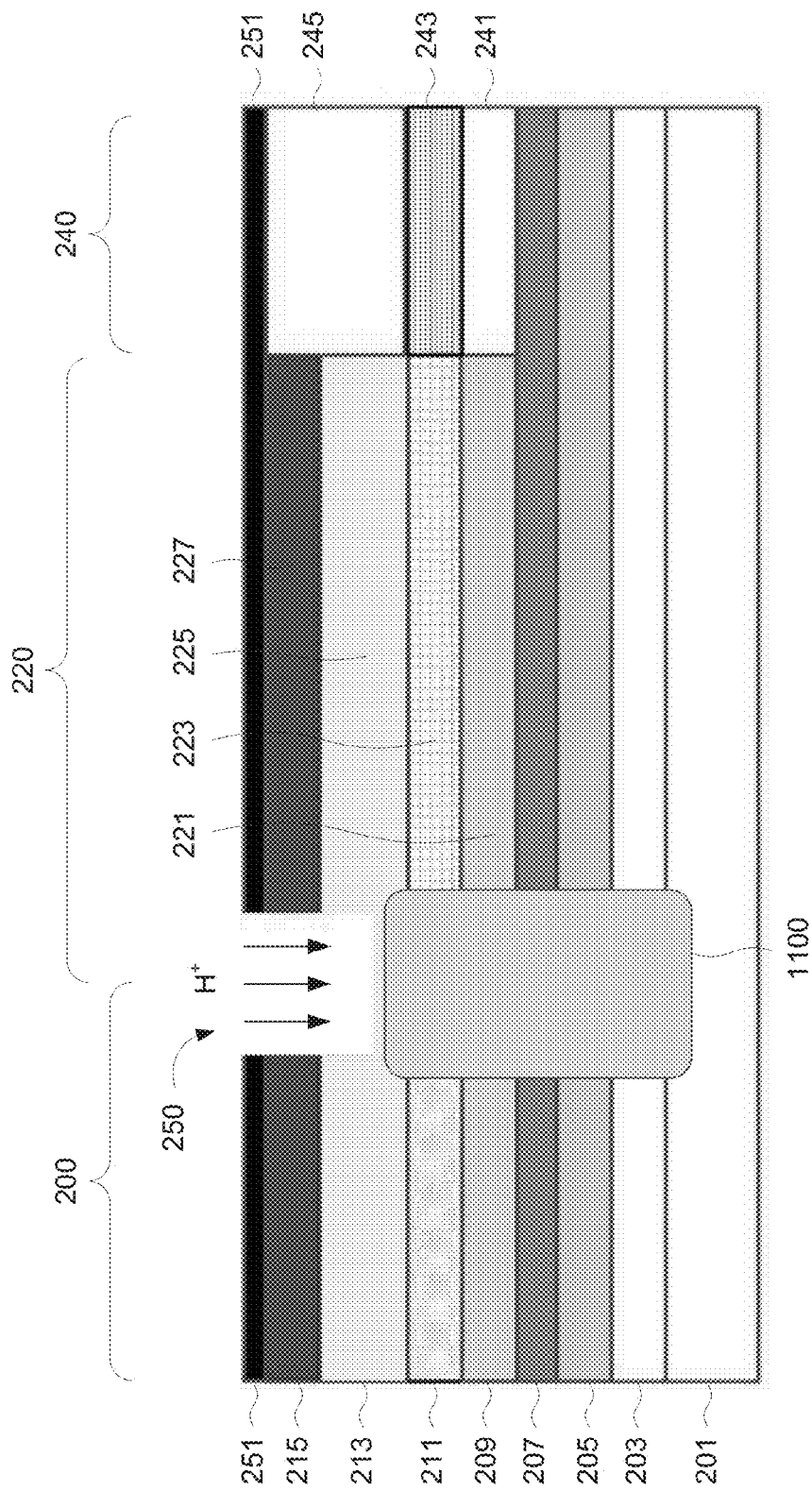

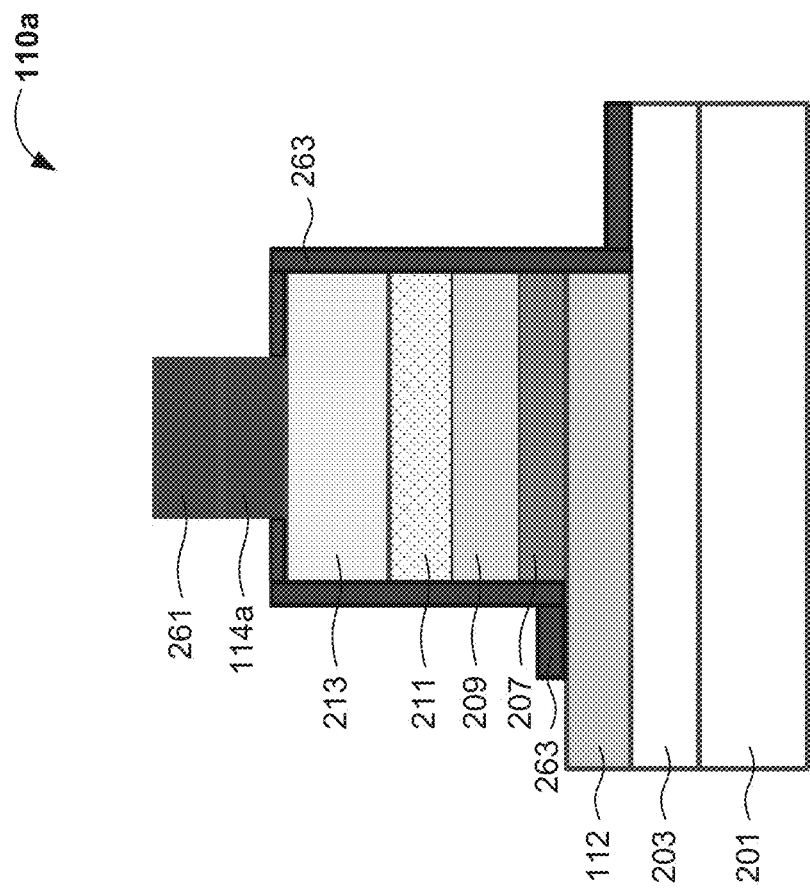

ISOLATED MODULATOR ELECTRODES FOR LOW POWER CONSUMPTION

FIELD OF THE INVENTION

The present invention generally relates to the field of light-emitting devices. More specifically, embodiments of the present invention pertain to isolated modulator electrodes (e.g., anodes and cathodes) for low power consumption in light-emitting devices.

DISCUSSION OF THE BACKGROUND

Light-emitting devices such as lasers are useful for optical signal generation in optoelectronic networks. Often, light from a laser is modulated to encode data or information onto the signal. One approach to modulating laser light is electro-absorption modulation (EAM), in which an electric potential applied across the modulator either allows light to pass through the modulator or creates a destructive interference pattern in the light passing into the modulator, thereby turning the light signal off.

To reduce power, the optical signal output by the electro-absorption modulated laser (EML) can be transmitted differentially. Differential modulation using electro-absorption modulators has either used discrete laser and modulator devices, or, if integrated on a single chip, the modulator section and the laser section generally have common electrical contact points. The common electrical contact points typically include the cathode, n-contact, and/or ground. The anodes or p-contacts of the laser section and modulator section are typically electrically isolated.

However, in a multi-channel transmitter (i.e., having a plurality of paired lasers and modulators), providing a common ground contact for the modulators does not allow for driving each modulator with a differential signal. Differential modulation has typically involved either a shared contact between the modulator section and laser section, or a laser that is not integrated onto the modulator chip.

This "Discussion of the Background" section is provided for background information only. The statements in this "Discussion of the Background" are not an admission that the subject matter disclosed in this "Discussion of the Background" section constitutes prior art to the present disclosure, and no part of this "Discussion of the Background" section may be used as an admission that any part of this application, including this "Discussion of the Background" section, constitutes prior art to the present disclosure.

SUMMARY OF THE INVENTION

Embodiments of the present invention relate to methods, architectures, circuits, and/or systems for making and/or using electro-modulated lasers (EMLs) having isolated modulator electrodes (e.g., both anodes and cathodes) for use in multi-channel optoelectronic devices. Such isolated electrodes advantageously reduce power consumption and/or increase transmission speeds in such devices. However, such systems, methods, etc. can also be applied to devices other than EMLs (for example, any type of integrated multi-channel system or method having multiple modulators that can benefit from electrical isolation from each other and/or from the signal source[s]). The present optoelectronic devices may be useful for optical communication, optical data storage, and other uses.

In one embodiment, a light-emitting device (e.g., an electro-modulated laser) can include (a) a substrate, (b) a lower contact layer on or over the substrate, the lower contact layer comprising a first lower contact in a first region of the substrate and a plurality of second lower contacts in a second region of the substrate, (c) a plurality of light-emitting thin film devices on or over the first lower contact in the first region of the substrate, (d) a plurality of light-modulating thin film devices on or over the plurality of second lower contacts in the second region of the substrate, (e) a plurality of first upper contacts on or over the plurality of light-emitting thin film devices, (f) a plurality of second upper contacts on or over the plurality of light-modulating thin film devices, and (g) an isolation region between the first and second regions of the substrate, electrically separating the plurality of first upper contacts and the plurality of second upper contacts.

In another embodiment, a method of making a multichannel light-emitting device can include (a) forming a lower contact layer on a substrate, (b) patterning the lower contact layer to form a first lower contact in a first region of the substrate and a plurality of second lower contacts in a second region of the substrate, (c) forming a first thin film PN structure on the first lower contact and the plurality of second lower contacts, (d) forming a first upper contact layer on the first thin film PN structure, (e) removing the first thin film PN structure and the first upper contact layer in the second region, (f) forming a second thin film PN structure and a second upper contact layer in the second region, and (g) forming an isolation region between the first and second regions, electrically separating the first upper contact layer and the second upper contact layer. As a result, the method generally forms a plurality of light-emitting devices in the first region and a plurality of light-modulating devices in the second region, and each light-emitting device may be paired with a light-modulating device to form an electro-modulated laser (EML).

In yet another embodiment, a multi-channel light-emitting device can include (a) a substrate, (b) a lower contact layer on or over the substrate, the lower contact layer comprising a first lower contact in a first region of the light-emitting device and a plurality of second lower contacts in a second region of the light-emitting device, (c) a plurality of laser diodes on or over the first lower contact in the first region, (d) a plurality of modulators on or over the plurality of second lower contacts in the second region, wherein each of the plurality of modulators is configured to modulate light from a corresponding one of the plurality of laser diodes, (e) a plurality of waveguides on or over a third region of the light-emitting device, wherein each of the plurality of waveguides is configured to direct light from a corresponding one of the plurality of modulators towards a target; (f) and a wave combiner configured to receive light from each of the plurality of waveguides.

By providing separate upper and lower contacts for each modulator, embodiments of the present invention can advantageously provide low-power differential drive capability for an integrated array of EML devices on a single chip or substrate. Embodiments of the present invention also provide an approach in which a plurality of lasers and modulators can be integrated on the same chip or substrate, but also electrically isolated from each other. Differential driving and EA modulation saves power and costs in an optoelectronic transmitter (TX) module. Thus, the present invention enables transceivers to integrate multiple EML devices on one chip or substrate for optical signal transmission, over a single fiber or parallel fibers. These and other advantages of the present invention will become readily apparent from the detailed description of various embodiments below.

BRIEF DESCRIPTION OF THE DRAWINGS

FIGS. 2-9 are cross-sectional views showing structures formed in an exemplary method of making the exemplary multi-channel light-emitting device of FIG. 1 in accordance with embodiments of the present invention.

FIG. 10A shows a cross-sectional view of an exemplary laser diode region of the multi-channel light-emitting device of FIG. 1 along the A-A' axis.

DETAILED DESCRIPTION

Figure 1:
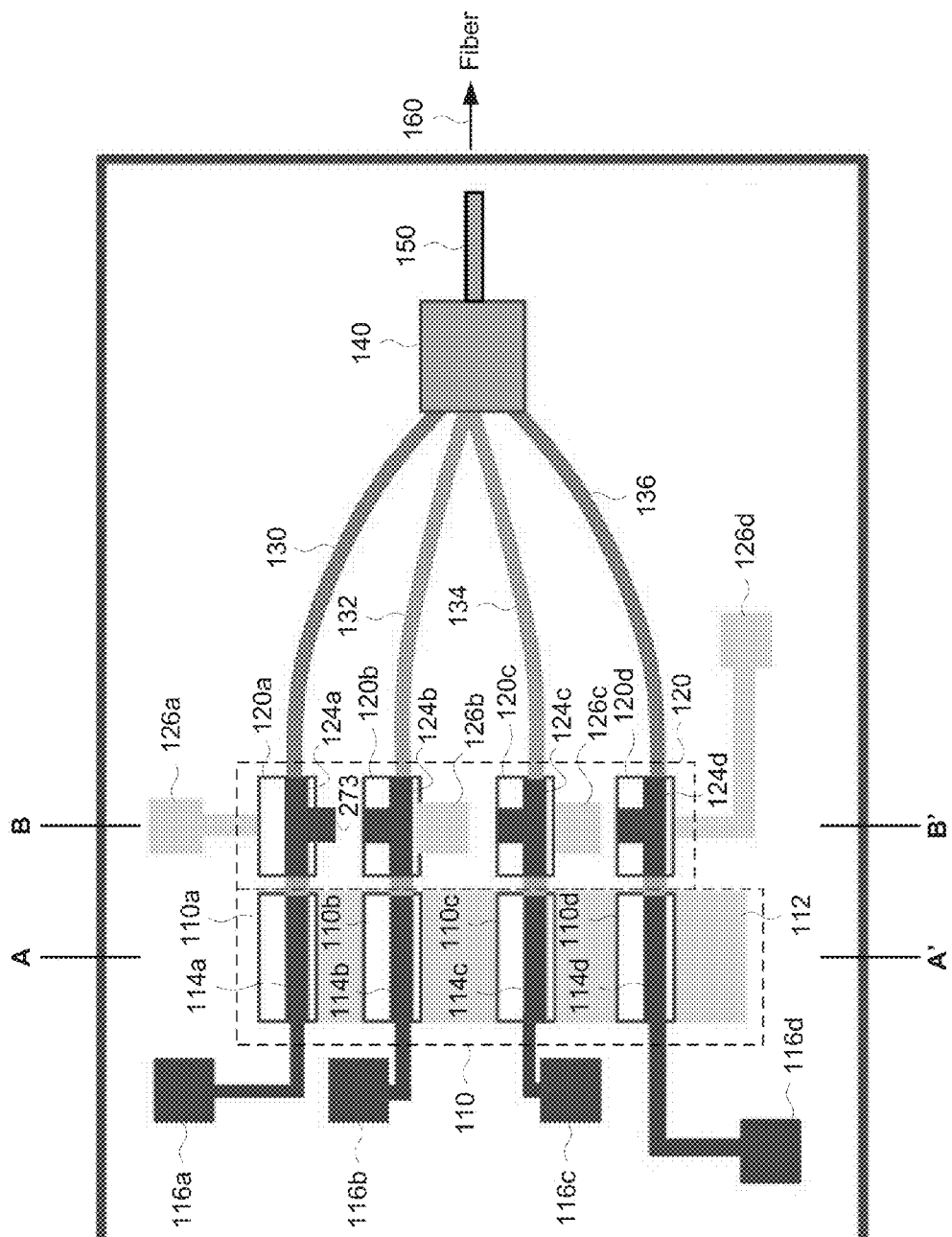
FIG. 1 shows an exemplary layout for a multi-channel light-emitting device in accordance with embodiments of the present invention.

Reference will now be made in detail to various embodiments of the invention, examples of which are illustrated in the accompanying drawings. While the invention will be described in conjunction with the following embodiments, it will be understood that the descriptions are not intended to limit the invention to these embodiments. On the contrary, the invention is intended to cover alternatives, modifications and equivalents that may be included within the spirit and scope of the invention as defined by the appended claims. Furthermore, in the following detailed description of the present invention, numerous specific details are set forth in order to provide a thorough understanding of the present invention. However, it will be readily apparent to one skilled in the art that the present invention may be practiced without these specific details. In other instances, well-known methods, procedures, components, and circuits have not been described in detail so as not to unnecessarily obscure aspects of the disclosure.

Some portions of the detailed descriptions that follow are presented in terms of processes, procedures, logic blocks, functional blocks, processing, and other symbolic representations of operations on signals, data bits, or data streams within a computer, processor, controller and/or memory. These descriptions and representations are generally used by those skilled in the data processing arts to effectively convey the substance of their work to others skilled in the art. A process, procedure, logic block, function, etc., is herein, and is generally, considered to be a self-consistent sequence of steps or instructions leading to a desired and/or expected result. The steps generally include physical manipulations of physical quantities. Usually, though not necessarily, these quantities take the form of electrical, magnetic, optical, or quantum signals capable of being stored, transferred, combined, compared, and otherwise manipulated in a computer or data processing system. It has proven convenient at times, principally for reasons of common usage, to refer to these signals as bits, streams, values, elements, symbols, characters, terms, numbers, or the like, and to their representations in computer programs or software as code (which may be object code, source code or binary code).

It should be borne in mind, however, that all of these and similar terms are associated with the appropriate physical quantities and/or signals, and are merely convenient labels applied to these quantities and/or signals. Unless specifically stated otherwise, or as will be apparent from the following discussions, it is appreciated that throughout the present application, discussions utilizing terms such as "processing," "operating," "calculating," "determining," or the like, refer to the action and processes of a computer, data processing system, or similar processing device (e.g., an electrical, optical, or quantum computing or processing device or circuit) that manipulates and transforms data represented as physical (e.g., electronic) quantities. The terms refer to actions and processes of the processing devices that manipulate or transform physical quantities within the component(s) of a circuit, system or architecture (e.g., registers, memories, other such information storage, transmission or display devices, etc.) into other data or information similarly represented as physical quantities within other components of the same or a different system or architecture.

Furthermore, in the context of this application, the terms "signal" and "optical signal" refer to any known structure, construction, arrangement, technique, method and/or process for physically transferring a signal or optical signal, respectively, from one point to another. Also, unless indicated otherwise from the context of its use herein, the terms "designated," "fixed," "given," "certain" and "predetermined" generally refer to a value, quantity, parameter, constraint, condition, state, process, procedure, method, practice, or combination thereof that is, in theory, variable, but is typically set in advance and not varied thereafter when in use.

Similarly, for convenience and simplicity, the terms "time," "rate," "period" and "frequency" are, in general, interchangeable and may be used interchangeably herein, but are generally given their art-recognized meanings. Also, for convenience and simplicity, the terms "data," "bits," "bit string," and "information" may be used interchangeably, as may the terms "coupled to," and "in communication with" (which may refer to direct or indirect connections, couplings, or communications), but these terms are generally given their art-recognized meanings herein.

For the sake of convenience and simplicity, the terms "laser," "EML," "light source," and "laser diode" are generally used interchangeably herein, but are generally given their art-recognized meanings. Also, for convenience and simplicity, the terms "modulator" and "electro-absorption modulator" may be used interchangeably, but these terms are also generally given their art-recognized meanings. The terms "thickness" or "height" may also be used interchangeably, but both, in the context of this application, are meant to refer to a vertical measurement For the sake of convenience and simplicity, the terms "optical" and "optoelectronic" are generally used interchangeably herein, and use of any one of these terms also includes the others, unless the context clearly indicates otherwise. Additionally, the term "transceiver" refers to a device having at least one data receiver and at least one data transmitter, and use of the term "transceiver" also includes the terms "receiver" and "transmitter," unless the context clearly indicates otherwise. Also, for convenience and simplicity, the terms "connected to," "coupled with," "communicating with," and "coupled to" (which terms also refer to direct and/or indirect relationships between the connected, coupled and/or communicating elements unless the context of the term's use unambiguously indicates otherwise). Such terms may be used interchangeably, but these terms are also generally given their art-recognized meanings. Various embodiments and/or examples disclosed herein may be combined with other embodiments and/or examples, as long as such a combination is not explicitly disclosed herein as being unfavorable, undesirable or disadvantageous. The invention, in its various aspects, will be explained in greater detail below with regard to exemplary embodiments.

An Exemplary Multi-Channel Light-Emitting Device

FIG. 1 illustrates an exemplary light emitting device 100 in accordance with embodiments of the present invention.

Light-emitting device 100 can include a laser array 110, an electro-absorption (EA) modulator array 120, a waveguide array 130, a wave combiner 140, a mode adjuster 150, and a fiber (or location at which a fiber is affixed or attached) 160. Laser array 110, modulator array 120, and the plurality of waveguides 130, 132, 134 and 136 may be on any non-conducting substrate and/or layer of material thereon capable of physically supporting a plurality of thin films and withstanding the heat generated by the laser devices (e.g., such as laser diodes and/or electrical modulators, described in more detail below with regard to the method of making a multi-channel light-emitting device).

Laser array 110 may comprise a plurality of lasers 110a-d. Lasers 110a-d may comprise solid state or semiconductor lasers (e.g., laser diodes, quantum cascade lasers, distributed feedback lasers, etc.). In the embodiment depicted in FIG. 1, the device comprises four lasers. However, any plural number of lasers (e.g., two or more) is possible. In one embodiment, lasers 110a-d comprise laser diodes, which are current driven devices that receive a bias voltage or current from a current source. Each laser 110a-d generally comprises a stack of layers of different materials, each such material having different physical, chemical and/or electrical properties (e.g., III-V type, II-VI type, or Group IV elemental semiconductors, such as GaN, InP, GaAs, AlGaAs, AlGaInP, InGaAsP, etc., each of which may be N-doped, P-doped, or intrinsic). The laser stacks are generally physically separate from each other, although they may share a single lower contact 112. The lasers 110a-d generally have separate upper contacts 114a-d. Each of the pads 116a-d electrically connected to respective upper contacts 114a-d provides a site for a wire bond or similar connection that provides an applied voltage, current, and/or power to an individual laser.

Each laser may transmit signals over a different channel of the optical or optoelectronic network and may generate or output a unique wavelength (or range of wavelengths) of light. The wavelength(s) of each channel generally do not overlap, and may differ from each other by 40 nm or more (e.g., each laser in the set of lasers 110a-d may generate a wavelength or range of wavelengths of light that is at least 40 nm greater than or less than the wavelength or range of wavelengths of light of the other lasers in the set). In one embodiment, the wavelengths may differ from each other by at least 50 nm, 60 nm or more (e.g., at least 100 nm).

Modulators vary one or more values or properties of a waveform (which may be a periodic waveform). The modulated waveform is known as the carrier signal, and in optoelectronics, the carrier signal is the light or optical output of a laser. In one embodiment, modulator array 120 may comprise a plurality of electro-absorption (EA) modulators 120a-d. Each modulator 120a-d generally comprises a stack of layers of different material, each material having different physical, chemical and/or electrical properties. Individual layers in the stack of layers may be the same as or different from corresponding layers in the laser stacks, but generally, at least one layer is different. Each modulator 120a-d may correspond to a unique one of the lasers 110a-d in laser array 110.

The modulators 120a-d may be electrically separated from the lasers 110a-d (e.g., by upper contacts 124a-d and lower contacts 122a-d [see FIG. 10] separate from the upper contacts 114a-d and lower contact 112 in the laser region 110), and optionally, at least partially physically separated from the lasers 110a-d (e.g., by an isolation region; see FIG. 8). The modulators 120a-d may also be physically separate from each other. Each modulator generally has separate upper contacts 124a-d and lower contacts 122a-d (not shown in FIG. 1). Modulators 120a-d may be configured to independently modulate the light or optical output from each of lasers 110a-d as a result of the electrically isolated lower contacts 122a-d. Each of pads 126a-d provides for contact or a wire bond to a wire for an individual modulator to receive signals (e.g., from a microcontroller or processor; not shown).

Light-emitting device 100 may include a plurality of waveguides 130, 132, 134 and 136. Each waveguide 130, 132, 134 and 136 may comprise a plurality of stacked layers of different materials having different physical and/or electrical properties, and may correspond to a unique one of the modulators 120a-d in modulator array 120. Generally, individual layers in the stack of layers may be the same as or different from corresponding layers in the laser and/or modulator stacks, but generally, the layers are different from the laser and/or modulator stacks (although one or more layers may match crystallographically a corresponding layer in the modulator stacks). The waveguides 130-136 may direct and/or transmit light or other electromagnetic energy (or permit light or other electromagnetic energy to pass through) from the modulators to a single location (e.g., wave combiner 140, discussed below).

Wave combiner 140 may receive light from modulator array 120 and combine the light signals from each of the modulators 120a-d for transmission over one or more optical fibers (typically, a single fiber 160). Prior to transmission over the fiber(s) 160, the light may be passed through a mode adjuster 150.

Thus, each paired laser and modulator (e.g., 110a and 120a, 110b and 120b, 110c and 120c, and 110d and 120d) forms an electro-absorption modulated laser (EML). Each EML has high DC resistance between the four contacts of the EML (i.e., between the lower contact 112 and corresponding upper contact 114 of an individual laser, and between each upper contact 124 and corresponding lower contact 122 of an individual modulator). In the case of an EML laser array, all of the modulators 120a-d are isolated from each other and from the lasers 110a-d, allowing for driving each signal differentially with a minimum of power consumption. The lasers share one lower contact 112 since they may be operated in direct current (DC) mode (e.g., with a fixed or predetermined voltage across the lower contact 112 and upper contacts 114a-d), and do not require varying electric potentials. Thus, for a plurality N of EMLs (laser-modulator pairs), where N is an integer of at least 2, there may be 3-N+1 independent and/or isolated contacts.

An Exemplary Method of Making a Light-Emitting Device

Figure 2:
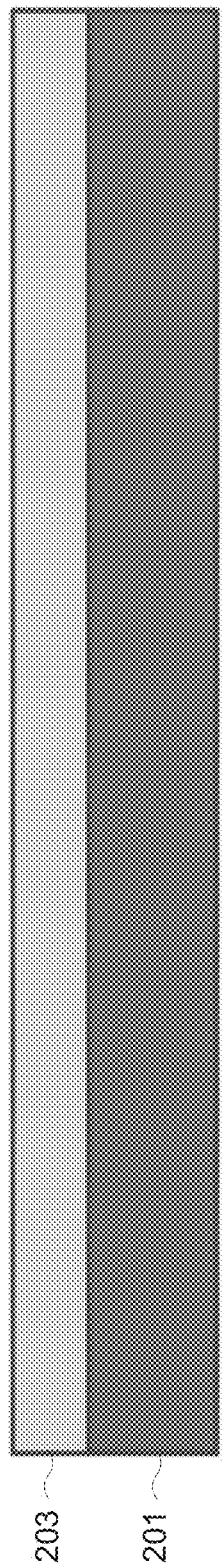

FIGS. 2-8 illustrate an exemplary method of making a multi-channel light-emitting device. Referring to FIG. 2, an intrinsic layer 203 may be formed on or over a semi-insulating (SI) substrate 201. Generally, the substrate 201 and intrinsic layer 203 comprise a non-conducting material. For example, substrate 201 may comprise a semi-insulating or non-conducting II-VI or III-V compound (e.g., CdSe, ZnS, ZnO, InP, GaAs, etc.), a Group IV element or alloy (e.g., Si, Ge, SiGe, etc.), or an insulating substrate such as $SiO_2$, $Al_2O_3$, an organic polymer such as a polyimide, a polyether ether ketone (PEEK), a polyalkylene aromatic diester such as polyethylene terephthalate, combinations thereof, etc. The substrate 201 may be a sheet, slip or wafer of single-crystal, partially-crystalline or amorphous material, or comprise a polycrystalline film on an amorphous or partially-crystalline insulating or semi-insulating material. Substrate 201 may have a thickness from about 5 μm to about 500 μm (e.g., 20-100 μm), or any value or range of values therein.

Intrinsic layer 203 may comprise or consist essentially of a compound semiconductor (e.g., a non-conducting or semi-insulating II-VI or III-V material such as CdSe, ZnS, ZnO, InP, GaAs, etc.), and be formed by epitaxial growth and/or chemical vapor deposition (e.g., metal organic chemical vapor deposition, or MOCVD) from known precursors under known deposition conditions. Each of the substrate 201 and the intrinsic layer 203 may contain a sufficient dose of n-type and/or p-type dopant to provide it with reliable and/or reproducible semi-insulative or intrinsic properties. In some embodiments, the intrinsic layer 203 has a crystallographic structure that substantially matches that of the substrate 201 or of the uppermost surface of the substrate 201. Intrinsic layer 203 may have a thickness from about 100 nm to about 10,000 nm, or any value or range of values therein.

Figure 3:
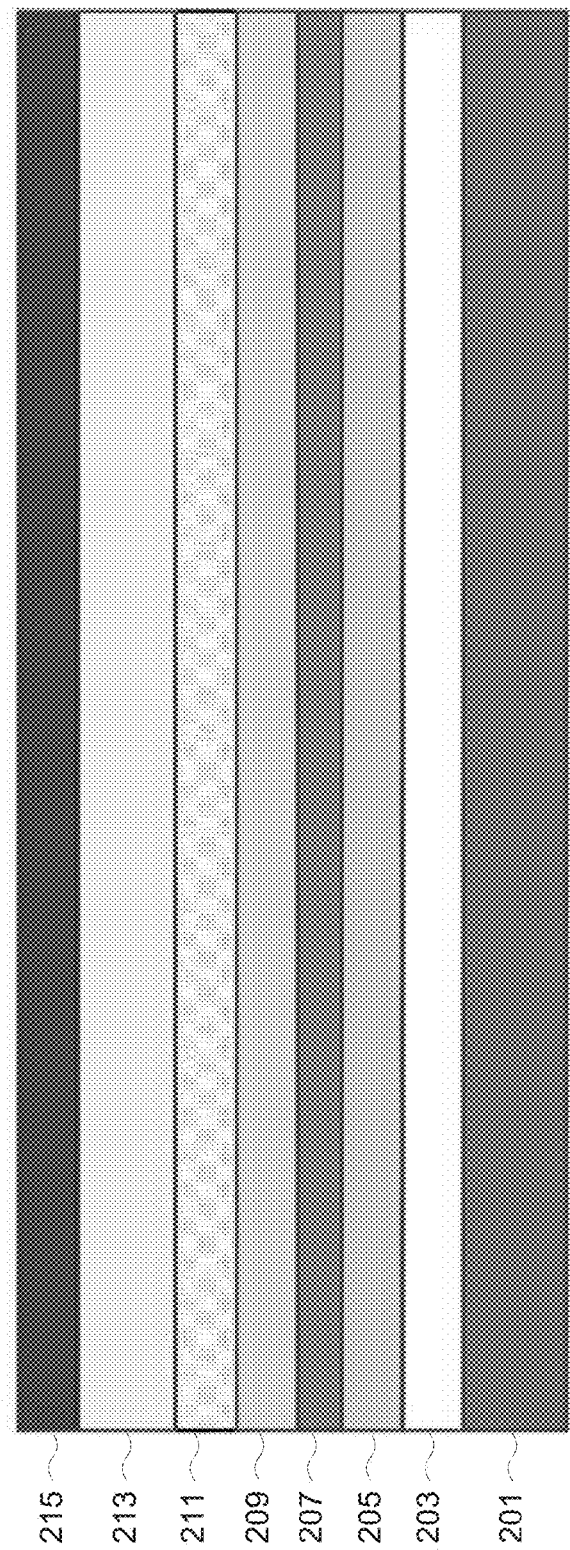

Referring to FIG. 3, additional layers may be formed in succession on or over substrate 201, including a lower (e.g., N-type) contact layer 205, an etch stop layer 207, a first thin film PN structure 209-213, and a first upper (e.g., first P-type) contact layer 215 on or over the first thin film PN structure. Thus, the etch stop layer 207 may be deposited on or over lower contact layer 205, the first thin film PN structure 209-213 may be deposited on or over etch stop layer 207, and the first upper contact layer 215 may be deposited on or over the first thin film PN structure 209-213.

Lower contact layer 205 may comprise a conductive material such as a metal (e.g., Al, Cu, Ag, Au, etc.), an alloy of two or more metals (e.g., Au/Cr, Au/Pt/Ti, or Au/Ge), an N-type semiconductor (e.g., a II-VI or III-V semiconductor or a Group IV elemental semiconductor as described herein, doped [e.g., heavily or very heavily] with P, As and/or Sb), and/or a conductive metal compound (e.g., TiN, $TiSi_x$, $WSi_x$, $TiSi_xN_y$, $WSi_xN_y$, indium tin oxide [ITO], etc.). Lower contact layer 205 may be formed by blanket deposition (e.g., CVD, sputtering, or MOCVD) and have a thickness of about 100 nm to 5,000 nm, or any value or range of values therein.

Etch stop layer 207 may comprise a compound semiconductor, elemental semiconductor, metal, alloy, conductive metal compound, or other substance that is etched at a rate much slower (e.g., tens or hundreds of times slower) than the etch rate of layer 209 formed above etch stop layer 207. For example, etch stop layer 207 may comprise a compound of the formula $A_aB_bY_yZ_z$, where A and B are both an element of Group 12 or Group 13 of the Periodic Table (e.g., A and B are each independently Zn or Cd, or A and B are each independently Ga, In or Tl), Y and Z are both independently an element of Group 15 of the Periodic Table (such as N, P, As or Sb) when A and B are each a Group 13 element, or an element of Group 16 of the Periodic Table (such as O, S, Se or Te) when A and B are each a Group 12 element, a+b=1, and y+z=1. When etch stop layer 207 comprises a compound of the formula $A_aB_bY_yZ_z$, the compound may be doped with a sufficient dose of n-type or p-type dopant to provide it with reliable and/or reproducible conductive properties (e.g., a relatively low ohmic resistance). In one embodiment, etch stop layer 207 comprises $In_{1-c}Ga_cAs_{1-x}P_x$, where 0<c<1 (e.g., 0.5) and 0<x<1 (e.g., 0.5). Etch stop layer 207 may be formed by blanket deposition (e.g., CVD, sputtering, or MOCVD) and may have a thickness of about 10 nm to 2,000 nm, or any value or range of values therein.

The first thin film PN structure 209-213 may include a first N-layer 209, a first quantum well layer 211 on or over the first N-layer 209, and a first P-layer 213 on or over the first quantum well layer 211. First N-layer 209 and first P-layer 213 may be formed by blanket depositing a III-V type semiconductor (e.g., InP or GaAs) or a Group IV semiconductor (e.g., silicon and/or germanium), then implanting one or more dopants into the semiconductor or diffusing the dopant(s) into the semiconductor material from a solid or vapor dopant source. The dopant(s) are then activated, typically by furnace or laser annealing. In one embodiment, layers 209 and 213 comprise a III-V compound (e.g., indium phosphide, or InP).

First N-layer 209 may further comprise an n-type dopant (e.g., phosphorus, arsenic and/or antimony) and may have a thickness from about 20 nm to about 10,000 nm, or any value or range of values therein. First N-layer 209 may differ from etch stop layer 207 in physical structure (e.g., crystallographically) and/or in chemical formula in a manner enabling first N-layer 209 to be selectively etched with respect to etch stop layer 207 (e.g., as explained below with regard to FIG. 4).

First quantum well layer 211 may be formed similarly to and/or from the same materials as first N-layer 209 and first P-layer 213, but may differ from layers 209 and 213 by the chemical composition and/or amount of dopant therein (e.g., layer 211 may comprise a dopant concentration of tens, hundreds, or thousands of times less than either of layers 209 or 213, or may remain undoped). First quantum well layer 211 may have a thickness from about 10 nm to about 10,000 nm, or any value or range of values therein. In some embodiments, first quantum well layer 211 (or first thin film PN structure 209-213) may comprise a layer of gallium arsenide (GaAs) between layers of aluminum arsenide (AlAs), or a layer of indium gallium nitride (InGaN) between layers of gallium nitride (GaN). See, e.g., U.S. patent application Ser. No. 13/820,102, filed Feb. 28, 2013, the relevant portions of which are incorporated by reference herein). First P-layer 213 may further comprise a p-type dopant (e.g., boron) and may have a thickness from about 20 nm to about 10,000 nm, or any value or range of values therein.

Each of the layers 205, 207, 209, 211, 213 and 215 may be formed by blanket deposition (e.g., by CVD, sputtering, evaporation, MOCVD or epitaxial growth). For example, forming layers 205, 207, 209, 211, 213 and 215 may comprise selective area growth (SAG) or selective area epitaxy (SAE), and/or may comprise growing alternating layers of compound semiconductors (e.g., InP and InGaAs). Growth of alternating layers of compound semiconductors may comprise vapor-phase epitaxy (e.g., metal-organic vapor-phase epitaxy, or MOVPE), molecular beam epitaxy (e.g., metal-organic molecular beam epitaxy, or MOMBE), and/or atomic layer deposition (ALD).

The first upper (e.g., first P-type) contact layer 215 may comprise a conductive material such as a metal (e.g., Al, Cu, Ag, Au, etc.), an alloy of two or more metals (e.g., Au/Cr, Au/Pt/Ti, or Au/Ge), a semiconductor (e.g., a II-VI or III-V semiconductor or a Group IV elemental semiconductor as described herein, doped [e.g., heavily or very heavily] with a P-type dopant [e.g., boron]), and/or a conductive metal compound (e.g., TiN, $TiSi_x$, $WSi_x$, $TiSi_xN_y$, $WSi_xN_y$, indium tin oxide [ITO], etc.). First upper contact layer 215 may be formed by blanket deposition (e.g., by CVD, sputtering, or MOCVD) and have a thickness from about 100 nm to about 5,000 nm, or any value or range of values therein.

Figure 4:
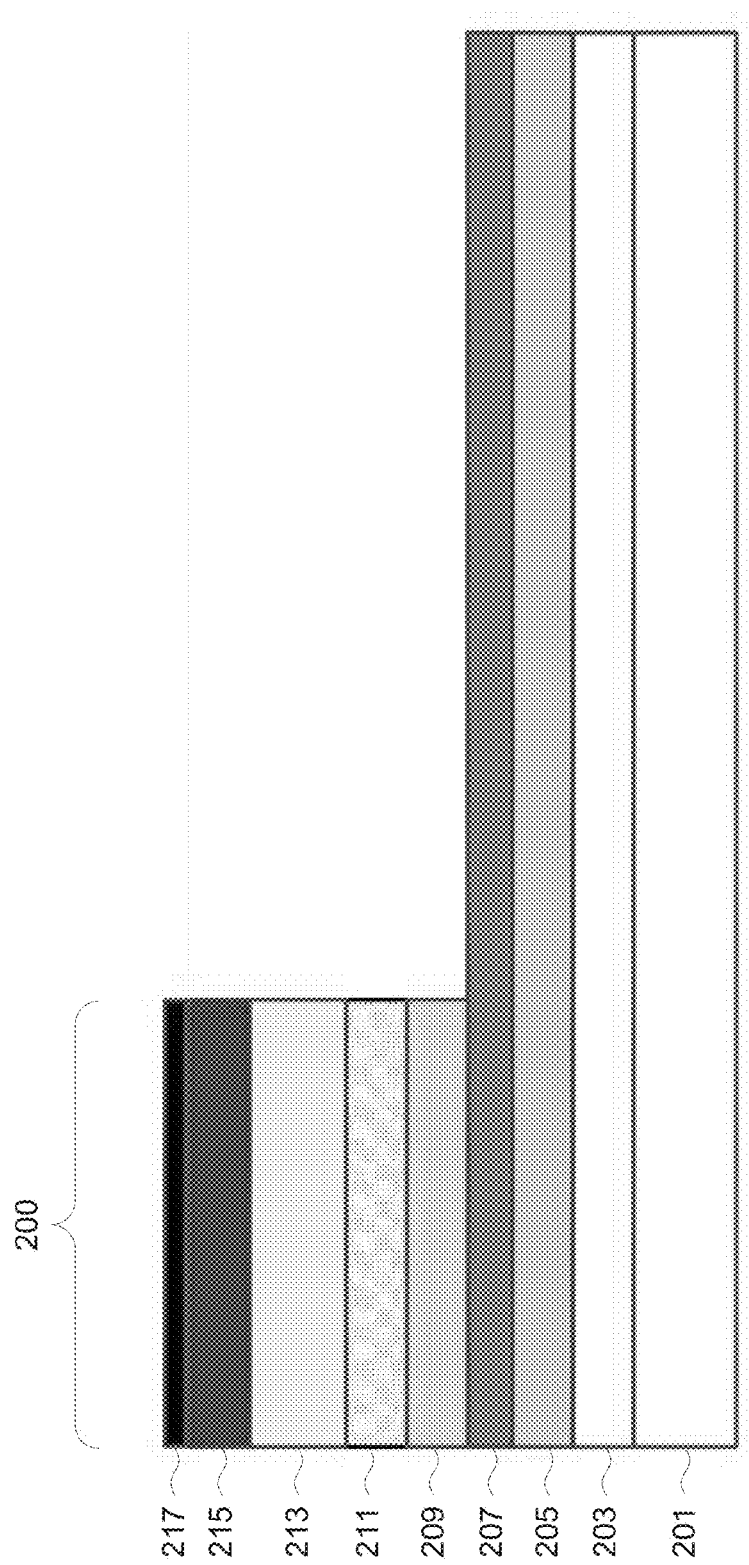

FIG. 4 illustrates the removal of portions of several layers. Generally, the same portion (e.g., area) is removed from each layer subject to such removal. An etching mask 217 may be formed over a first region (e.g., light source region) 200 to facilitate the removal of portions of several layers in a second region (e.g., modulator region) 220 (see FIG. 6) and, optionally, a third region (e.g., waveguide region) 240 (see FIG. 7). Etching mask 217 may comprise a conventional positive or negative photoresist, or an oxide of the material of first upper contact layer 215. Etching mask 217 may be formed by depositing a photoresist on first upper contact layer 215 and patterning the photoresist such that etching mask 217 remains over light source region 200. Alternatively, a photoresist may be patterned on first upper contact layer 215 above the portions of layers 209-213 that are to be removed, an oxide may be grown on the remaining (exposed) surface of layer 215, the photoresist removed, and the layers underlying the removed photoresist may be etched. Etching mask 217 may have a thickness from about 2,000 nm to about 10,000 nm, or any value or range of values therein.

In one embodiment, portions of the first thin film PN structure 209-213 (e.g., including first N-layer 209, first quantum well layer 211, and first P-layer 213) and first upper contact layer 215 are removed by photolithography and etching. Removal of the portions of layers 209-215 exposed through etching mask 217 may be performed by selective etching (e.g., layers 209-213 may be selectively etched relative to the material of etching mask 217 and etch stop layer 207) until etch stop layer 207 is exposed. Etching mask 217 may then be removed by conventional processing.

The light source region 200 of the device may correspond to the light-emitting (e.g., laser or laser diode) region. The stack of layers corresponding to the light source region 200 of the device may be retained during the processes shown in FIGS. 5-8 before individual lasers 110a-d are patterned (see FIGS. 1 and 9).

Figure 5:
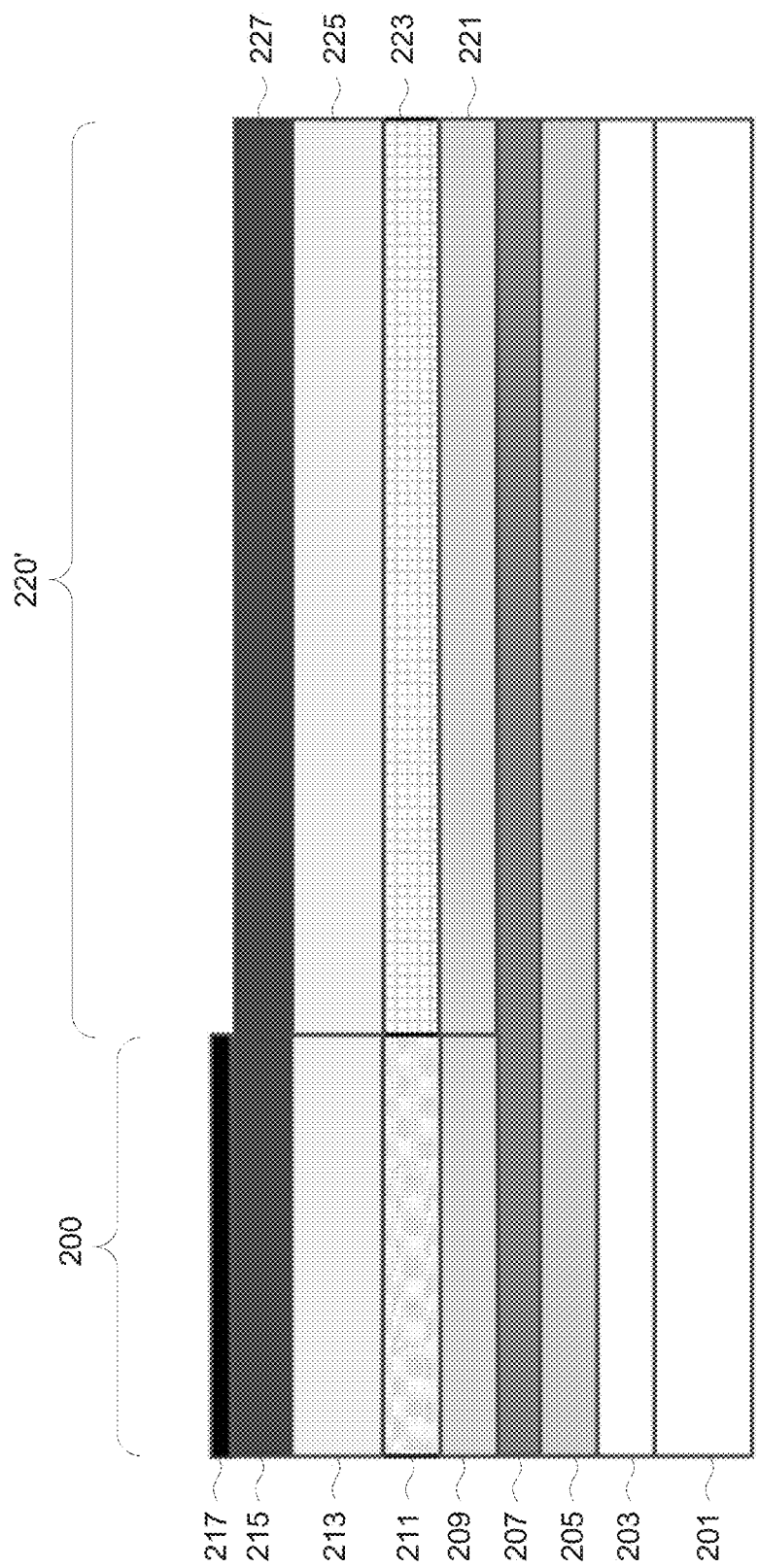

FIG. 5 illustrates the formation (or re-formation) of several layers 221-227 in a location 220' of the removed portion(s) of layers shown in FIG. 4. These subsequently formed or re-formed layers may include a second thin film PN structure 221-225 and a second upper (e.g., second P-type) contact layer 227 on or over the second thin film PN structure 221-225.

The second thin film PN structure 221-225 may include a second N-layer 221, a second quantum well layer 223 on or over the second N-layer 221, and a second P-layer 225 on or over the second quantum well layer 223. Each of layers 221, 223, 225 and 227 may be formed by selective epitaxy. For example, forming layers 221, 223, 225 and 227 may comprise selective area growth (SAG) or selective area epitaxy (SAE), and/or may comprise growing alternating layers of compound semiconductors (e.g., InP and InGaAs). Growth of alternating layers of compound semiconductors may comprise vapor-phase epitaxy (e.g., MOVPE), molecular beam epitaxy (e.g., MOMBE), or atomic layer deposition.

Second N-layer 221 and second P-layer 225 may be doped by implanting an N-type or P-type dopant into the respective semiconductor layer (e.g., a III-V type semiconductor such as InP or GaAs, or a Group IV semiconductor such as silicon and/or germanium) or diffusing the dopant into the semiconductor material from a solid or vapor dopant source. The dopant(s) are then activated, typically by furnace or laser annealing. In one embodiment, layers 221 and 225 each comprise a III-V compound (e.g., indium phosphide, or InP).

Second N-layer 221 may further comprise an n-type dopant (e.g., phosphorus, arsenic and/or antimony) and may have a thickness from about 20 nm to about 10,000 nm, or any value or range of values therein. Second N-layer 221 may differ from etch stop layer 207 in physical structure (e.g., crystallographically) and/or in chemical formula in a manner enabling second N-layer 221 to be selectively etched with respect to etch stop layer 207.

Second quantum well layer 223 may be formed similarly to and/or from the same materials as second N-layer 221 and second P-layer 225, but may differ from layers 221 and 225 by chemical composition and/or by the amount of dopant therein (e.g., layer 223 may comprise a dopant concentration of tens, hundreds or thousands of times less than either of layers 221 or 225). Second quantum well layer 223 may have a thickness from about 10 nm to about 10,000 nm, or any value or range of values therein. In some embodiments, second quantum well layer 223 (or second thin film PN structure 221-225) may comprise a layer of gallium arsenide (GaAs) between layers of aluminum arsenide (AlAs) or a layer of indium gallium nitride (InGaN) between layers of gallium nitride (GaN). See, e.g., U.S. patent application Ser. No. 13/820,102, filed Feb. 28, 2013, the relevant portions of which are incorporated by reference herein).

Second quantum well layer 223 may differ from first quantum well layer 211 in physical structure and/or chemical composition. However, second quantum well layer may also comprise a compound of the formula $A_aB_bY_yZ_z$, where A and B are both an element of Group 12 or Group 13 of the Periodic Table (e.g., A and B are each independently Zn or Cd, or A and B are each independently Ga, In or Tl), Y and Z are both independently an element of Group 15 of the Periodic Table (such as N, P, As or Sb) when A and B are each a Group 13 element, or an element of Group 16 of the Periodic Table (such as O, S, Se or Te) when A and B are each a Group 12 element, a+b=1, and y+z=1. In one embodiment, first and second quantum well layers may comprise the same or different compositions of the formula $In_xGa_{(1-x)}As_yP_{(1-y)}$, where $0<x<1$ and $0<y<1$. First quantum well layer 211 and second quantum well layer 223 may be substantially aligned with each other (e.g., the layers may have lower and upper surfaces that are horizontally aligned). See, e.g., U.S. patent application Ser. No. 13/820,102, filed Feb. 28, 2013, the relevant portions of which are incorporated by reference herein). Alternatively, a lower surface of second quantum well layer 223 may be below a lower surface of first quantum well layer 211, and/or an upper surface of second quantum well layer 223 may be above an upper surface of first quantum well layer 211. Second P-layer 225 may further comprise a p-type dopant (e.g., boron) and may have a thickness from about 20 nm to about 10,000 nm, or any value or range of values therein.

The second upper (e.g., second P-type) contact layer 227 may comprise a conductive material such as a metal (e.g., Al, Cu, Ag, Au, etc.), an alloy of two or more metals (e.g., Au/Cr, Au/Pt/Ti, or Au/Ge), a semiconductor (e.g., a II-VI or III-V semiconductor or a Group IV elemental semiconductor as described herein, doped [e.g., heavily or very heavily] with a P-type dopant [e.g., boron]), and/or a conductive metal compound (e.g., TiN, $TiSi_x$, $WSi_x$, $TiSi_xN_y$, $WSi_xN_y$, indium tin oxide [ITO], etc.). Second upper contact layer 227 may be formed by blanket deposition (e.g., by CVD, sputtering, or MOCVD) and have a thickness from about 100 nm to about 5,000 nm, or any value or range of values therein.

FIG. 6 illustrates the removal of portions of several layers from region 220'. Generally, the same portion (e.g., area) is removed from each layer subject to such removal. An etching mask 219 may be formed over the light source region 200 and the modulator region 220 to facilitate the removal of portions of several layers in the waveguide region of the device 240 (see FIG. 7). Etching mask 219 may comprise a conventional positive or negative photoresist, or an oxide of the material of second upper contact layer 227. Etching mask 219 may be formed by depositing a photoresist on the first upper contact layer 215 and second upper contact layer 227 and patterning the photoresist such that etching mask 219 remains over light source region 200 and modulator region 220. Alternatively, a photoresist may be patterned on second upper contact layer 227 above the portions of layers 221-225 that are to be removed, an oxide may be grown on layer 215 and the remaining (exposed) surface of layer 227, the photoresist removed, and the layers underlying the removed photoresist may be etched. Etching mask 219 may have a thickness from about 2,000 nm to about 10,000 nm, or any value or range of values therein. After removing portions of layers 221-227 exposed by the etching mask 219, etching mask 219 may be removed by conventional processing (e.g., ashing).

The modulator region 220 of the device may correspond to a light-modulating region (e.g., an electro-absorption modulator region) of the device. The stack of layers corresponding to the modulator region 220 may be retained during the processes shown in FIGS. 7-8 before individual modulators 120a-d are patterned (see FIGS. 1 and 10).

FIG. 7 illustrates the formation (or re-formation) of one or more layers in the waveguide region 240, where portion(s) of layers 221, 223, 225 and 227 were removed in FIG. 6. The new layers in FIG. 7 include a first intrinsic layer 241, a waveguide layer 243 on or over the first intrinsic layer 241, and a second intrinsic layer 245 on or over the waveguide layer 243. Layers 241-245 are useful in forming a plurality of waveguides (e.g., waveguides 130-136 of FIG. 1). Each of the layers 241, 243 and 245 may be formed by selective epitaxy. For example, layers 241, 243 and 245 may be formed by selective area growth (SAG) or selective area epitaxy (SAE). Alternatively, layers 241-245 may comprise alternating layers of different compound semiconductors (e.g., InP and InGaAs). Growth of alternating layers of compound semiconductors may comprise vapor-phase epitaxy (e.g., MOVPE), molecular beam epitaxy (e.g., MOMBE), and/or atomic layer deposition.

Waveguide layer 243 may comprise a III-V type semiconductor (e.g., InP or GaAs) or a Group IV semiconductor (e.g., silicon and/or germanium). Second quantum well layer 223 and waveguide layer 243 may be substantially aligned with each other (e.g., the layers may have lower and upper surfaces which are horizontally aligned). Alternatively, a lower surface of waveguide 243 may be below a lower surface of second quantum well layer 223, and an upper surface of waveguide 243 may be above an upper surface of second quantum well layer 223. The waveguide region 240 ideally guides or directs light (or other electromagnetic energy) from the modulator region 220 to the wave combiner 140 (see FIG. 1), preferably with minimal loss. The waveguides generally do not include contacts and may function without a current or voltage being applied thereto.

FIG. 8 illustrates the formation of an isolation region 250. After conventional removal of etch mask 219, etching mask 251 may be formed to facilitate the removal of portions of upper contact layer(s) 215 and/or 227. Etching mask 251 generally comprises a conventional positive or negative photoresist. Etching mask 251 may be formed by depositing a photoresist on first upper contact layer 215 and second upper contact layer 227 and patterning the photoresist or oxide to expose an isolation region 250. Etching mask 251 may have a thickness of about 2,000 nm to 10,000 nm or any range of values therein.

The first upper contact layer 215 and/or second upper contact layer 227 are removed from the interface between light source region 200 and modulator region 220, thereby separating (e.g., electrically separating) the first upper contact layer 215 from the second upper contact layer 227. Additionally, portions of the first P-layer 213 and/or second P-layer 225 underlying the removed portions of layers 215 and/or 227 may be removed (e.g., about 20 nm to about 9,000 nm [e.g., about 100 nm to about 4000 nm] or about 10-90% [e.g., about 50-80%] of the thickness of each of layers 213 and 225, or any value or range of values therein).

The layers 215 and/or 227 (and optionally, 213 and 225) may be removed by selective etching from the boundary or interface between the light source and modulator regions 200 and 220 to form an isolation region 250. The isolation region 250 isolates upper contacts 114a-d (FIG. 1) in light source region 200 from the upper contacts 124a-d in modulator region 220, thereby enabling lasers and modulators to be integrated on the same chip or substrate 201, but to be electrically isolated from each other.

Figure 10B:
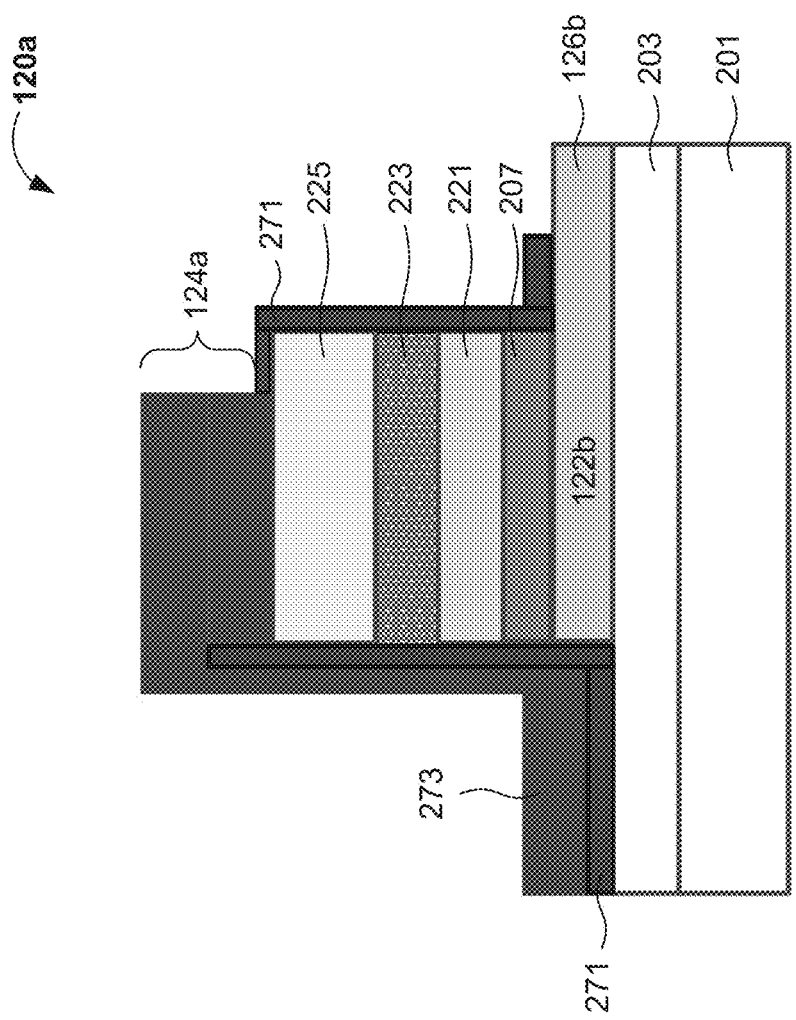
FIG. 10B shows a cross-sectional view of an exemplary modulator region of the multi-channel light-emitting device of FIG. 1 along the B-B' axis.

FIG. 9 illustrates an ion implantation process which may be performed subsequent to the patterning of isolation region 250, resulting in individual lasers and modulators as depicted in FIGS. 1, 10A and 10B. Hydrogen ions (H$^+$) may be implanted into isolation region 250 to form a region 1100 extending into layers 201-213, in a dose and/or at an energy sufficient to electrically insulate the first N-layer 209, first quantum well layer 211, first P-layer 213, second N-layer 221, second quantum well layer 223, second P-layer 225, and lower contact layer 205, at the interface between the light source and modulator regions 200 and 220 and further isolate each laser 110a-d from the corresponding modulator 120a-d. The ions are generally implanted in a sufficient concentration and/or dose to reduce or eliminate any conductive properties of the material(s) into which they are implanted, but to leave the physical and/or optical properties of the material(s) unaffected (or substantially unaffected).

FIG. 10A illustrates a cross-sectional view of laser diode 110a along the A-A' axis of FIG. 1, and FIG. 10B illustrates a cross-sectional view of modulator 120a along the B-B' axis of FIG. 1. The stack of layers shown in FIG. 10A corresponds to laser (e.g., laser diode) 110a of FIG. 1, which is representative of the layers in light source region 200 of FIGS. 4-9. Laser 110a includes substrate 201, intrinsic layer 203, lower contact 112 (which is patterned from lower contact layer 205), etch stop layer 207, first N-layer 209, first quantum well layer 211, first P-layer 213, upper contact 114a (which is patterned from first upper contact layer 215), and conductive layer 261. Conductive layer 261 may comprise a metal layer in electrical contact with upper contact 114a (see FIG. 1).

The stack of layers shown in FIG. 10B corresponds to modulator 120a of FIG. 1 which is representative of the layers in modulator region 220 of FIGS. 6-9. Individual modulator 120a includes substrate 201, intrinsic layer 203, lower contact 122b (which is patterned from lower contact layer 205 and may be physically and/or electrically connected to pad 126b), etch stop layer 207, second N-layer 221, second quantum well layer 223, second P-layer 225, upper contact 124b (which is patterned from second upper contact layer 227), and conductive layer 273. Conductive layer 273 may comprise a metal layer in electrical contact with upper contact 124a (see FIG. 1).

After formation of the layers of the first region (e.g., light source region) 200, second region (e.g., modulator region) 220, and, optionally, third region (e.g., waveguide region) 240, further processing or patterning steps may be performed. For example, individual lasers (e.g., lasers 110a-d of FIG. 1) and individual modulators (e.g., modulators 120a-d of FIG. 1) may be patterned from the structure shown in FIG. 9. For example, the individual lasers 110a-d and individual modulators 120a-d may be patterned by photolithography and etching.

Forming individual lasers 110a-d and individual modulators 120a-d may include depositing a first mask over the upper contact layers 215 and 227 to define the lasers 110a-d and modulators 120a-d. The first mask may comprise a lower hard mask comprising or consisting essentially of silicon dioxide ($SiO_2$) and an upper mask comprising or consisting essentially of a photoresist over the silicon dioxide hard mask. The first mask may be patterned such that the first mask remains on regions corresponding to the individual lasers 110a-d, individual modulators 120a-d, and the isolation regions 250 therebetween. The exposed regions may then be etched by dry etching and/or wet etching down to the etch stop layer 207, thus forming the individual lasers 110a-d, modulators 120a-d, and, optionally, waveguides 130-136.

Alternatively, the first mask may comprise a photoresist patterned on the regions to be removed (e.g., regions between individual lasers 110a-d and between individual modulators 120a-d), an oxide grown on the remaining upper surface, the photoresist removed, and the layers underlying the removed photoresist etched. The photoresist and/or oxide may be removed by conventional processing. In embodiments in which the first mask comprises a lower silicon dioxide hard mask and an upper photoresist-based mask, the photoresist may be removed, leaving the silicon dioxide hard mask in place to protect the upper contact layers 215 and 227.

Etch stop layer 207 and lower contact layer 205 may then be exposed and patterned. For example, a second mask, which may comprise a photolithographically-patterned photoresist, may expose portions of etch stop layer 207. Exposed portions of etch stop layer 207 and lower contact layer 205 thereunder may be removed by selective wet or dry (e.g., plasma) etching.

The $SiO_2$ hard mask and the second mask may then be removed by conventional processing (e.g., ashing and etching with dilute and/or buffered aqueous HF, respectively), and a passivation layer 263/271 may then be blanket deposited. Passivation layer 263/271 may be respectively formed on exposed surfaces of the laser stack (e.g., layers 207, 209, 211 and 213) and modulator stack (e.g., layers 207, 221, 223 and 225), and may also be formed on or over intrinsic layer 203 and/or lower contact 112. Forming passivation layer 263/271 may comprise coating exposed surfaces with one or more inorganic barrier layers such as a polysiloxane and/or a nitride, oxide and/or oxynitride of silicon and/or aluminum, and/or one or more organic barrier layers such as parylene, a fluorinated organic polymer or other barrier material known in the art. Alternatively or additionally, the passivation layer may comprise an underlying dielectric layer (e.g., an oxide (e.g., $SiO_2$, TEOS, undoped silicate glass [USG], fluorosilicate glass [FSG], borophosphosilicate glass [BPSG], etc.) which may be formed from a material having a lower stress than that of the overlying passivation layer.

A third mask comprising or consisting essentially of a photoresist may then be deposited and photolithographically patterned. The passivation layer may then be wet or dry etched, then the exposed etch stop layer 207 may be removed by selective wet or dry etching, to expose the lower contact layer 205.

A "lift-up" process may then be performed to form the upper contacts 114a/261 and 124a/273. A fourth mask comprising a photoresist suitable for a conventional lift-up process may be deposited and patterned to expose areas where the upper contact layers 261 and 273 are to be formed. A metal layer may then be blanket deposited over the wafer or substrate 201. After deposition of the metal layer, the patterned fourth mask is then removed by physically lifting the mask up from the surface of the wafer. The metal layer (e.g., conductive layers 261 and 273 of FIGS. 10A and 10B, respectively) on areas where the upper contact layers 215 and 227 are to be formed will remain on the upper contact layers 114a and 124a. All other metal (i.e., metal on the photoresist of the fourth mask) will be removed ("lifted up") with the fourth mask. The upper contact layers 261 and 273 are thus patterned to form the individual upper contacts 114a-d in light source region 200 and individual upper contacts 124a-d and 273 in modulator region 220, respectively.

Thus, the present invention provides individual lasers having separate upper contacts and individual modulators having both (i) separate upper contacts and (ii) separate lower contacts on a single chip or substrate. Thus, a plurality of lasers and modulators can be integrated on the same chip or substrate, and electrically isolated from each other. Consequently, low-power differential drive capability for an integrated array of EML devices on one chip or substrate is possible, enabling transceivers to integrate multiple EML devices on one chip or substrate for optical signal transmission.

CONCLUSION(S)

Embodiments of the present invention advantageously provide for individual light emitting devices (e.g., laser diodes) having separate upper contacts and individual modulators having electrically separate upper contacts and lower contacts. Thus, a plurality of individual lasers and modulators can be integrated on the same chip or substrate, and also be electrically isolated from each other. Consequently, low-power differential drive capability for an integrated array of EML devices on one chip or substrate is possible, enabling transceivers to integrate multiple EML devices on one chip or substrate for low power optical signal transmission.

The foregoing descriptions of specific embodiments of the present invention have been presented for purposes of illustration and description. They are not intended to be exhaustive or to limit the invention to the precise forms disclosed, and obviously many modifications and variations are possible in light of the above teachings. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

What is claimed is:

1. A light-emitting device, comprising:
   a substrate;
   a lower contact layer on or over the substrate, the lower contact layer comprising a first lower contact in a first region of the substrate and a plurality of second lower contacts in a second region of the substrate;
   a plurality of light-emitting thin film devices on or over the first lower contact and electrically contacting the first lower contact in the first region of the substrate;
   a plurality of light-modulating thin film devices on or over the plurality of second lower contacts in the second region of the substrate, wherein each of the light-modulating thin film devices electrically contacts a unique one of the second lower contacts;
   a plurality of first upper contacts on or over the plurality of light-emitting thin film devices, wherein each of the first upper contacts electrically contacts a unique one of the light-emitting thin film devices;
   a plurality of second upper contacts on or over the plurality of light-modulating thin film devices, wherein each of the second upper contacts electrically contacts a unique one of the light-modulating thin film devices; and
   an isolation region between the first and second regions of the substrate, electrically separating the plurality of first upper contacts and the plurality of second upper contacts.

2. The light-emitting device of claim 1, wherein each of the light emitting thin film devices comprises:

a first N-layer on or over the substrate;
a first quantum well layer on or over the first N-layer; and
a first P-layer on or over the first quantum well layer.

3. The light-emitting device of claim 2, wherein each of the light-modulating thin film devices comprises:
a second N-layer on or over the substrate;
a second quantum well layer on or over the second N-layer; and
a second P-layer on or over the second quantum well layer.

4. The light-emitting device of claim 3, wherein the second quantum well layer differs from the first quantum well layer.

5. The light-emitting device of claim 3, wherein each of the first and second first N-layers and the first and second P-layers comprise a III-V type semiconductor.

6. The light-emitting device of claim 1, further comprising an intrinsic layer on or over the substrate, wherein the lower contact layer is on the intrinsic layer.

7. The light-emitting device of claim 1, further comprising an etch stop layer on or over the lower contact layer.

8. The light-emitting device of claim 1, wherein each of the first lower contact, the plurality of second lower contacts, the plurality of first upper contacts and the plurality of second upper contacts comprise a conductive material.

9. The light-emitting device of claim 1, further comprising a plurality of waveguides on or over a third region of the substrate.

10. The light-emitting device of claim 9, wherein each of the plurality of waveguides comprises (i) a first intrinsic layer, (ii) a waveguide layer on or over the first intrinsic layer, and (iii) a second intrinsic layer on or over the waveguide layer.

11. The light-emitting device of claim 1, wherein the substrate comprises a semi-insulating substrate.

12. A method of making a multichannel light-emitting device, comprising:
forming a lower contact layer on a substrate;
patterning the lower contact layer to form a first lower contact in a first region of the substrate and a plurality of second lower contacts in a second region of the substrate;
forming a first thin film PN structure on the first lower contact and the plurality of second lower contacts and electrically contacting the first lower contact;
forming a first upper contact layer on the first thin film PN structure;
removing the first thin film PN structure and the first upper contact layer in the second region;
forming a second thin film PN structure and a second upper contact layer in the second region; and
forming an isolation region between the first and second regions, electrically separating the first upper contact layer and the second upper contact layer and thereby forming a plurality of light-emitting devices and a plurality of first upper contacts in the first region and a plurality of light-modulating devices and a plurality of second upper contacts in the second region, wherein each of the plurality of first upper contacts electrically contacts a unique one of the light-emitting devices, each of a plurality of the second upper contacts electrically contacts a unique one of the light-modulating devices, and each of the light-modulating devices electrically contacts a unique one of the second lower contacts.

13. The method of claim 12, further comprising, prior to forming the lower contact layer, forming an intrinsic layer on the substrate.

14. The method of claim 12, wherein forming the first thin film PN structure comprises:
forming a first N-layer on or over the substrate;
forming a first quantum well layer on or over the first N-layer; and
forming a first P-layer on or over the first quantum well layer.

15. The method of claim 14, wherein forming the second thin film PN structure comprises:
forming a second N-layer in the second region;
forming a second quantum well layer on or over the second N-layer; and
forming a second P-layer on or over the second quantum well layer.

16. The method of claim 15, wherein the second N-layer, the second quantum well layer, and the second P-layer are formed by selective epitaxy.

17. The method of claim 15, wherein the first quantum well layer and the second quantum well layer comprise different materials.

18. The method of claim 15, wherein each of the first and second N-layers and the first and second P-layers comprise a III-V type semiconductor.

19. The method of claim 14, wherein the lower contact layer, the first N-layer, the first quantum well layer, the first P-layer and the first upper contact layer are formed by metal organic chemical vapor deposition (MOCVD).

20. The method of claim 12, further comprising, prior to forming the first thin film PN structure, forming an etch stop layer on or over the first lower contact and the plurality of second lower contacts.

21. The method of claim 12, wherein forming the isolation region comprises removing a portion of the first upper contact layer and a portion of the second upper contact layer at a boundary between the first upper contact layer and second upper contact layer.

22. The method of claim 12, wherein each of the first upper contact layer and the second upper contact layer comprise a conductive material.

23. The method of claim 12, further comprising removing the second thin film PN structure and the second upper contact layer in a third region of the substrate, and forming a waveguide in the third region.

24. The method of claim 23, wherein forming the waveguide comprises forming a first intrinsic layer, forming a waveguide layer on the first intrinsic layer, and forming a second intrinsic layer on the waveguide layer.

25. A multi-channel light-emitting device, comprising:
a substrate;
a lower contact layer on or over the substrate, the lower contact layer comprising a first lower contact in a first region of the light-emitting device and a plurality of second lower contacts in a second region of the light-emitting device;
a plurality of laser diodes on or over the first lower contact in the first region and electrically contacting the first lower contact;
a plurality of first upper contacts in the first region, wherein each of the plurality of first upper contacts electrically contacts a unique one of the plurality of laser diodes;
a plurality of modulators on or over the plurality of second lower contacts in the second region and electrically contacting a unique one of the second lower contacts, wherein each of the plurality of modulators is configured to modulate light from a corresponding one of the plurality of laser diodes;
a plurality of second upper contacts in the second region, wherein each of the plurality of second upper contacts electrically contacts electrically contacts a unique one of the modulators;

a plurality of waveguides on or over a third region of the light-emitting device, wherein each of the plurality of waveguides is configured to direct light from a corresponding one of the plurality of modulators towards a target; and a wave combiner configured to receive light from each of the plurality of waveguides.

26. The multi-channel light-emitting device of claim 25, wherein each of the plurality of modulators comprises an electro-absorption modulator.

27. The multi-channel light-emitting device of claim 26, wherein each of the laser diodes comprises a first N-layer on or over the substrate, a first quantum well layer on or over the first N-layer, and a first P-layer on or over the first quantum well layer; and each of the electro-absorption modulators comprises a second N-layer on or over the substrate, a second quantum well layer on or over the second N-layer, and a second P-layer on or over the second quantum well layer, the second quantum well layer differing from the first quantum well layer.

* * * * *